United States Patent
Jain

(10) Patent No.: US 6,768,668 B2
(45) Date of Patent: *Jul. 27, 2004

(54) CONVERTING VOLATILE MEMORY TO NON-VOLATILE MEMORY

(75) Inventor: Raj Kumar Jain, Mandarin Gardens (SG)

(73) Assignee: Infineon Technologies Aktiengesellschaft, Munich (DE)

(*) Notice: Subject to any disclaimer, the term of this patent is extended or adjusted under 35 U.S.C. 154(b) by 116 days.

This patent is subject to a terminal disclaimer.

(21) Appl. No.: 10/117,665

(22) Filed: Apr. 4, 2002

(65) Prior Publication Data

US 2002/0186580 A1 Dec. 12, 2002

Related U.S. Application Data

(63) Continuation-in-part of application No. 09/806,395, filed on Jun. 21, 2001, now Pat. No. 6,560,136.

(51) Int. Cl.$^7$ ............................................. G11C 11/00
(52) U.S. Cl. ......................... 365/154; 364/177; 364/187
(58) Field of Search ................................ 365/154, 177, 365/187, 149

(56) References Cited

U.S. PATENT DOCUMENTS

| | | | |
|---|---|---|---|
| 4,203,159 A | 5/1980 | Wanlass | |
| 4,292,677 A | 9/1981 | Boll | |
| 4,571,703 A | 2/1986 | Noda | |
| 4,768,172 A | 8/1988 | Sasaki | |
| 5,040,146 A | 8/1991 | Mattausch et al. | |
| 5,717,638 A | 2/1998 | Kim | |
| 5,737,261 A | * 4/1998 | Taira | 365/145 |
| 5,757,694 A | 5/1998 | Mitani | |
| 5,761,113 A | 6/1998 | Natsume et al. | |
| 5,796,650 A | * 8/1998 | Wik et al. | 365/150 |
| 5,812,476 A | * 9/1998 | Segawa | 365/222 |
| 5,946,261 A | 8/1999 | Artieri | |
| 5,959,931 A | 9/1999 | Ueda | |
| 5,963,468 A | 10/1999 | Rao | |
| 6,026,012 A | 2/2000 | Hsue | |
| 6,118,689 A | 9/2000 | Kuo et al. | |
| 6,469,924 B2 | * 10/2002 | Jain | 365/154 |
| 6,545,905 B2 | * 4/2003 | Jain | 365/154 |

FOREIGN PATENT DOCUMENTS

EP          0 024 874 A2    3/1981

OTHER PUBLICATIONS

IBM Technical Disclosure Bulletin, Mar., 1981, pp. 4620–4621. Delphion, "Read Write Dynamic Memory Using Two Devices Per Cell and Having Internal Refresh."

* cited by examiner

*Primary Examiner*—Connie C. Yoha
(74) *Attorney, Agent, or Firm*—Horizon IP Pte Ltd

(57) ABSTRACT

The invention relates to a method for converting volatile memory cells to non-volatile memory cells with minimal modifications. There is included a volatile memory cell which is modified to permanently retain data by using one refresh port to transmit an active low voltage signal and configuring one terminal of the storage transistor to receive either an active high or low voltage signal.

19 Claims, 13 Drawing Sheets

US 6,768,668 B2

CONVERTING VOLATILE MEMORY TO NON-VOLATILE MEMORY

This is a continuation-in-part of patent application, titled: "Single-Port Memory Cell", U.S. Ser. No. 09/806,395 filed Jun. 21, 2001 now U.S. Pat. No. 6,560,136.

FIELD OF THE INVENTION

The present invention relates generally to memory cells. More particularly, the invention relates to the method of converting volatile memory cells to non-volatile memory cells.

BACKGROUND OF THE INVENTION

Integrated circuits (ICs) such as digital signal processors (DSPs) include embedded on-chip memory for storage of information. The on-chip memory typically comprises, for example, an array of static random access memory (SRAM) cells connected by word lines in one direction and bit lines in another direction. SRAMs are classified as volatile memories since the stored information is lost once power is removed from the IC. Other types of volatile memories include dynamic random access memories (DRAMs).

FIG. 1 shows a conventional SRAM cell 101. The SRAM cell comprises first and second transistors 110 and 120 coupled to a latch 130, which stores a bit of information. One transistor is coupled to a bit line 140 and the other is coupled to a bit line complement 141 while the gates are coupled to a word line 135. The latch includes first and second inverters 133 and 134, each implemented with two transistors.

Another type of memory called Read-Only-Memory (ROM), is classified as non-volatile since the information is retained even when the power is off. This class of memory stores data in preprogrammed storage cells. The contents of a ROM cannot be altered once the device has been manufactured.

FIGS. 2(a) and 2(b) show a conventional ROM cell 201 storing one bit of information. The ROM cell comprises a transistor 202, with a first terminal coupled to a bit line 204, and a gate coupled to a control word line 206. Depending on the information to be stored (i.e. logic '1' or '0'), the second terminal of the transistor is coupled to an active high voltage source (e.g. $V_{DD}$) as shown in FIG. 2(a), or an active low voltage source (e.g. $V_{SS}$) as shown in FIG. 2(b).

During the initial development of a program, volatile memories (e.g. SRAMs or DRAMs) offer flexibility for software designers to modify the program. Since volatile memory loses its information once the power is turned off, it has to be reprogrammed every time the system is shut down. Once the program design is fixed and no further changes are required, it is desirable to replace the volatile memory with non-volatile memory (e.g. ROMs) to retain the information even after the power is turned off.

The conversion of volatile memories such as DRAMs or SRAMs to non-volatile memories such as different types of ROMs typically involves complete layout modifications as the two types of memories are of different sizes. Such massive changes will result in large costs and low efficiency in production.

As evidenced from the above discussion, it is desirable to provide an improved method of converting volatile memory to non-volatile memory with minimal modifications.

SUMMARY OF THE INVENTION

The invention relates to a method for converting volatile memory cells to non-volatile memory cells. In one embodiment of the invention, a volatile memory cell comprising two access transistors and one storage transistor is converted to a non-volatile memory cell by deactivating one access transistor via a control word line which is coupled to an active low voltage source, and activating the storage transistor by supplying the gate of the storage transistor with an active high voltage level.

In accordance with one embodiment of the invention, one terminal of the storage transistor is coupled either to the active low voltage source via the control word line, or to the active high voltage source, depending on logic states to be stored.

These and additional features of the present invention will be described in more detail in the following figures and detailed description of the invention.

PREFERRED EMBODIMENTS OF THE INVENTION

The present invention relates generally to memory cells. In particular, it relates to a method for converting volatile memory cells to non-volatile memory cells.

Figure 1:
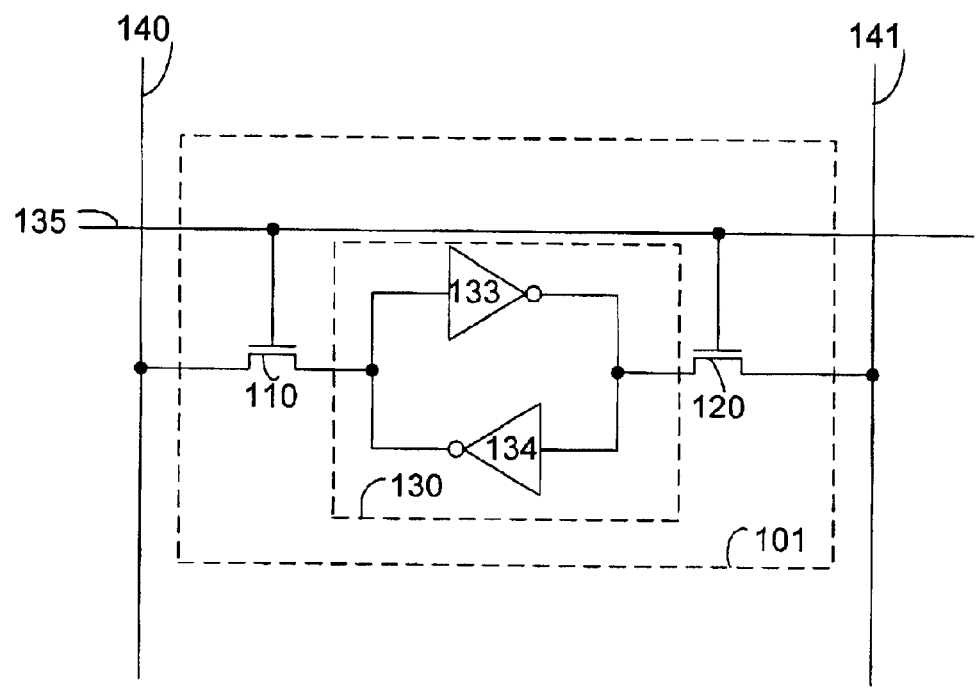
FIG. 1 depicts a conventional SRAM cell.
Figure 2A:
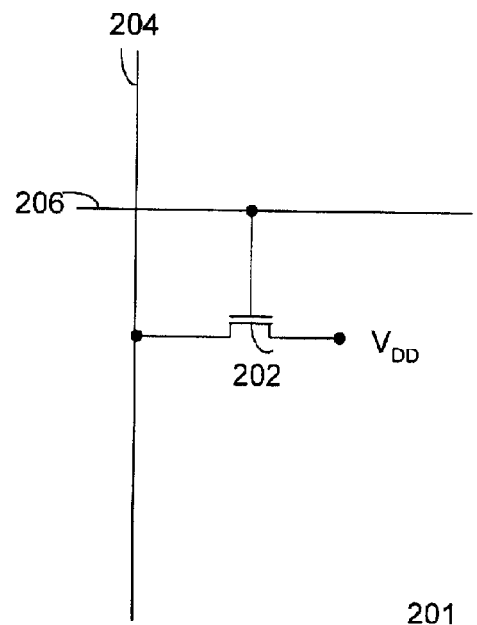
FIGS. 2(a) and 2(b) depict a conventional ROM cell.
Figure 2B:
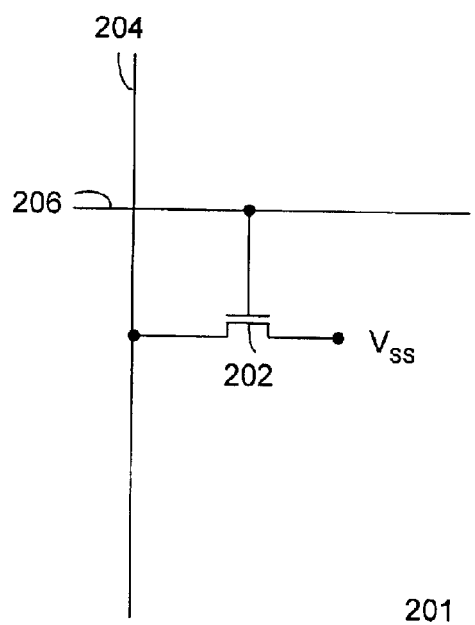
Figure 3:
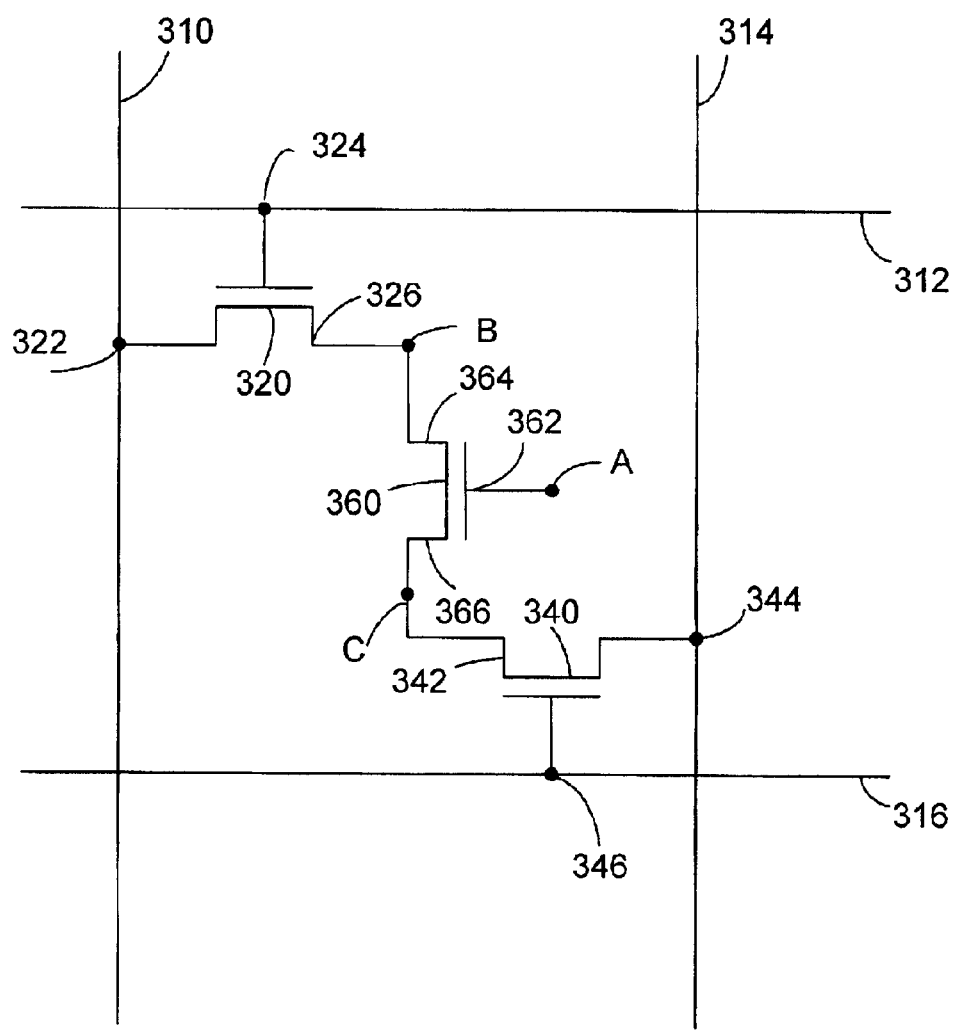
FIG. 3 shows a volatile memory cell.

FIG. 3 shows a volatile memory cell 301 in accordance with one embodiment of the invention. The memory cell comprises first and second access transistors 320 and 340 coupled in series to a storage transistor 360. The transistors, in one embodiment, are n-FETs. The use of p-FETs or a combination of n-FETs and p-FETs is also useful.

The first access transistor serves as the memory access port and is coupled to a bit line 310 and a word line 312; the second access transistor serves as the refresh port and is coupled to a refresh bit line 314 and refresh word line 316. A gate 362 of the storage transistor is coupled to an active high signal at node A to render the transistor conductive. In one embodiment, an n-FET storage transistor has its gate coupled to an active high voltage $V_{DD}$, which is higher than the threshold voltage of the storage transistor. As such, when power is applied to the IC, the storage transistor is rendered conductive, coupling node B to node C. When power is removed from the IC, nodes B and C are isolated from each other.

To perform a memory access, the word line 312 is activated or selected to render the first access transistor 320 conductive. As a result, node B is coupled to the bit line 310 via terminal 322 of the first access transistor. The charge stored at node B is transferred to the bit line for a read access or the charge on the bit line is transferred to node B for a write. A refresh is performed by activating refresh word line 316 to render the second access transistor conductive, coupling node C to the refresh bit line 314 via terminal 344. The operation of such a memory cell is described in patent application, titled: "Memory Architecture with Refresh and Sense Amplifiers", U.S. Ser. No. 09/855147, which is herein incorporated by reference for all purposes. The use of other types of volatile memory cells is also useful.

In accordance with the principles of the invention, the information stored in the memory cell can be permanently retained with minimal modifications. Since the refresh port 340 is not required in a non-volatile memory cell, the refresh port is deactivated. In one embodiment, the refresh port is coupled to an inactive signal or voltage level (e.g. $V_{SS}$ or ground for an n-FET access transistor), instead of being coupled to a refresh decoder.

Figure 4A:
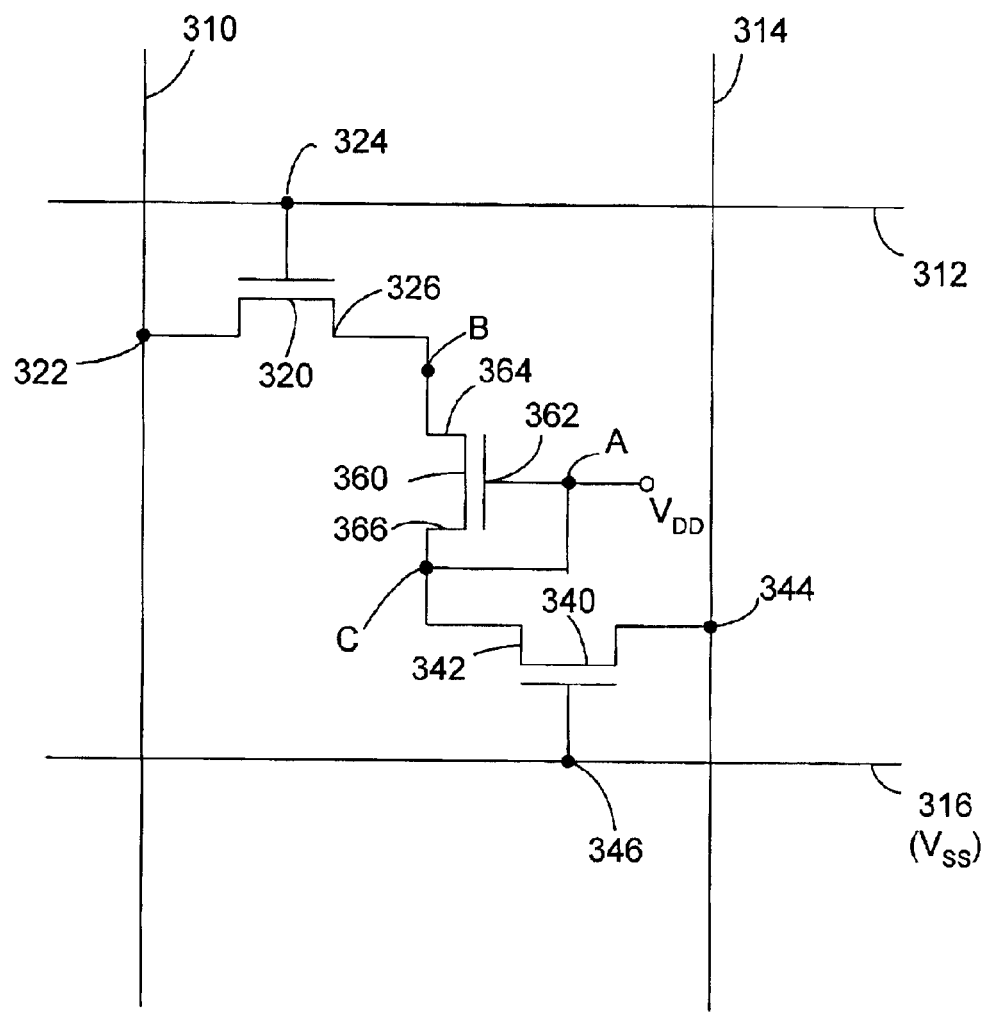
FIGS. 4(a) and 4(b) depict, according to one embodiment of the invention, the conversion of a volatile memory cell to a non-volatile memory cell.
Figure 4B:
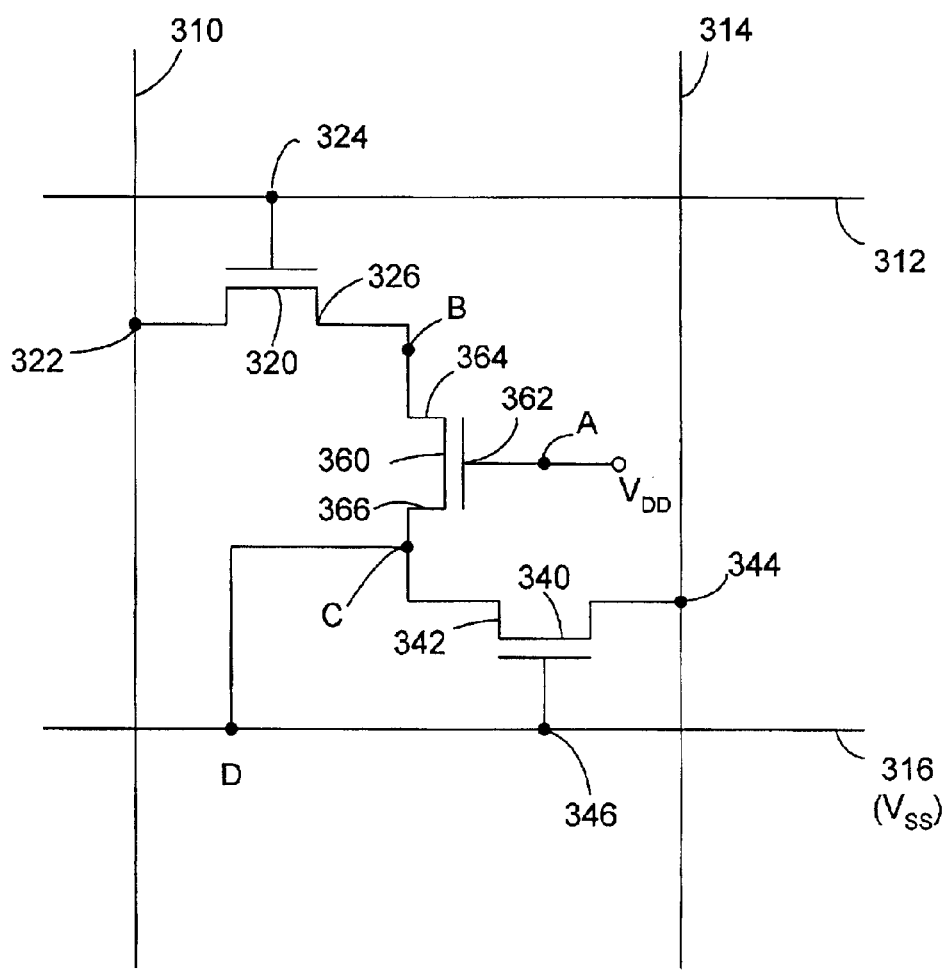

One embodiment of the invention is shown in FIGS. 4(a) and 4(b). The storage transistor and access transistors are n-FETs. The use of p-FETs or a combination of n-FETs and p-FETs is also useful. To deactivate the second access transistor or refresh port 340, the gate 346 is coupled to an inactive voltage source (logic '0') via the refresh word line 316. The inactive voltage source comprises a voltage level lower than the threshold voltage of the access transistor 340. The storage transistor 360 is rendered conductive by applying its gate 362 with $V_{DD}$.

The voltage level at node C is switched to either $V_{DD}$ or $V_{SS}$ voltage level, according to the desired information to be stored (i.e. logic '1' or logic '0' respectively). In one embodiment, as shown in FIG. 4(a), logic '1' is stored by coupling node C to node A, where $V_{DD}$ is applied. When power is supplied to the IC, the storage transistor 360 is activated. The power is also applied to node C, causing node C to be at $V_{DD}$. As a result, when the word line 312 is activated to render the first access transistor 320 conductive, the charge stored at node C is transferred to node B, and finally to the bit line 310 for read access, via transistor 320 and terminal 322. Similarly, as shown in FIG. 4(b), logic '0' is stored by coupling node C to a low voltage level of $V_{SS}$ or ground. In one embodiment, node C is coupled to refresh word line 316 at node D, causing node C to be at $V_{SS}$.

Figure 5A:
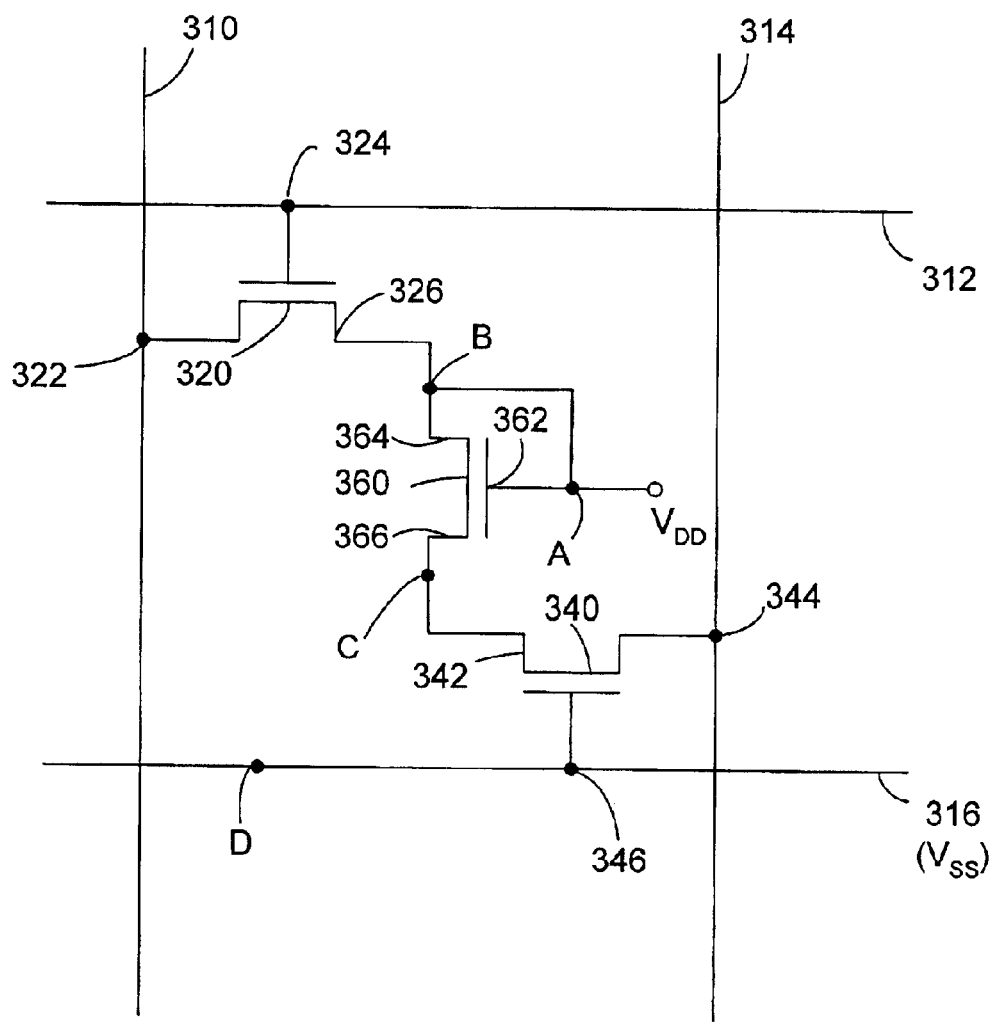
FIGS. 5(a) and 5(b) depict an alternative embodiment of the invention.
Figure 5B:
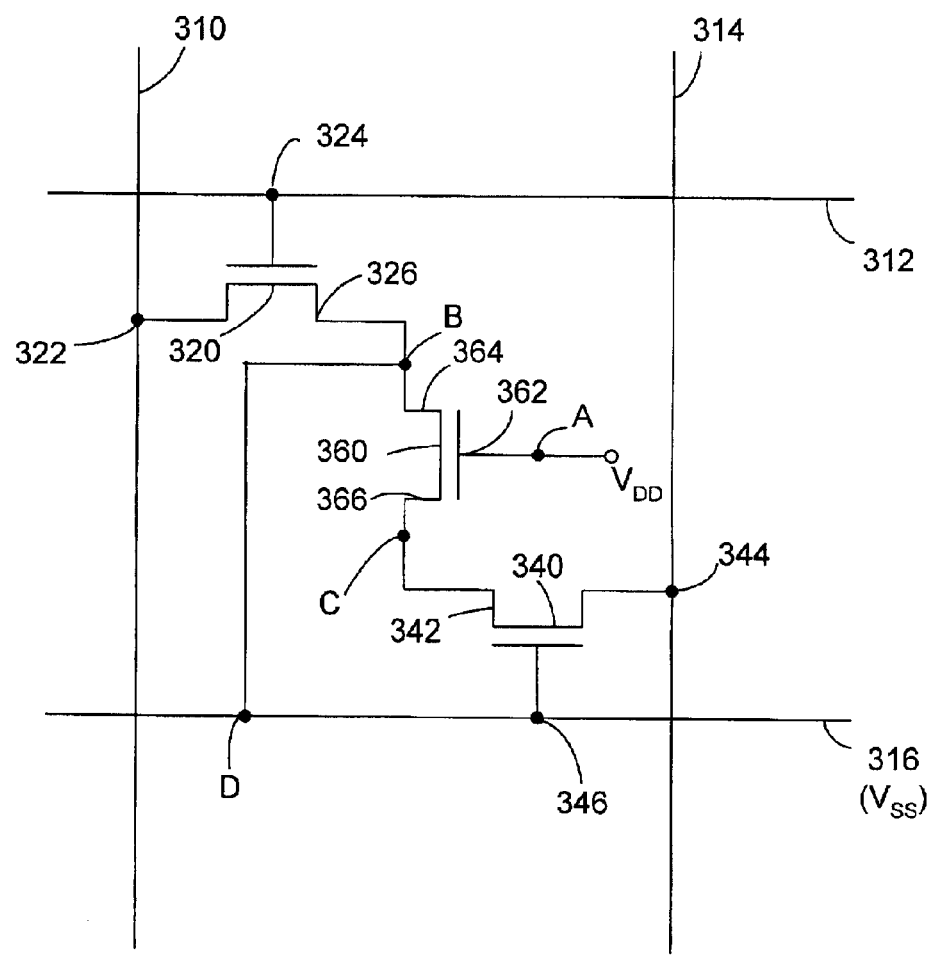

According to another embodiment shown in FIGS. 5(a) and 5(b), node B is switched to either $V_{DD}$ or $V_{SS}$ voltage level, according to the desired information to be stored. Referring to FIG. 5(a), a logic state '1' is stored by coupling node B to node A, where $V_{DD}$ is applied. When the word line 312 is activated to render the first access transistor 320 conductive, charge from the $V_{DD}$ source is directly transferred to the bit line 310 for read access, via transistor 320 and terminal 322. Since the storage transistor 360 is effectively bypassed, there is less resistance in the current path, resulting in higher power efficiency.

As shown in FIG. 5(b), logic '0' is stored by coupling node B to node D, where $V_{SS}$ is applied. The logical low voltage level at node D is transferred to node B. When the word line 312 is activated to render the transistor 320 conductive, the logical low voltage level at node B is transmitted to bit line 310 via terminal 322 for read access.

As described, the conversion of a RAM cell in accordance to one embodiment of the invention to a ROM can be achieved by setting node B or node C to either a logic '1' or logic '0' state for storing a logic '1' or logic '0'. It is understood that it is not necessary to use exclusively just node B or node C for conversion purposes.

Figure 6:
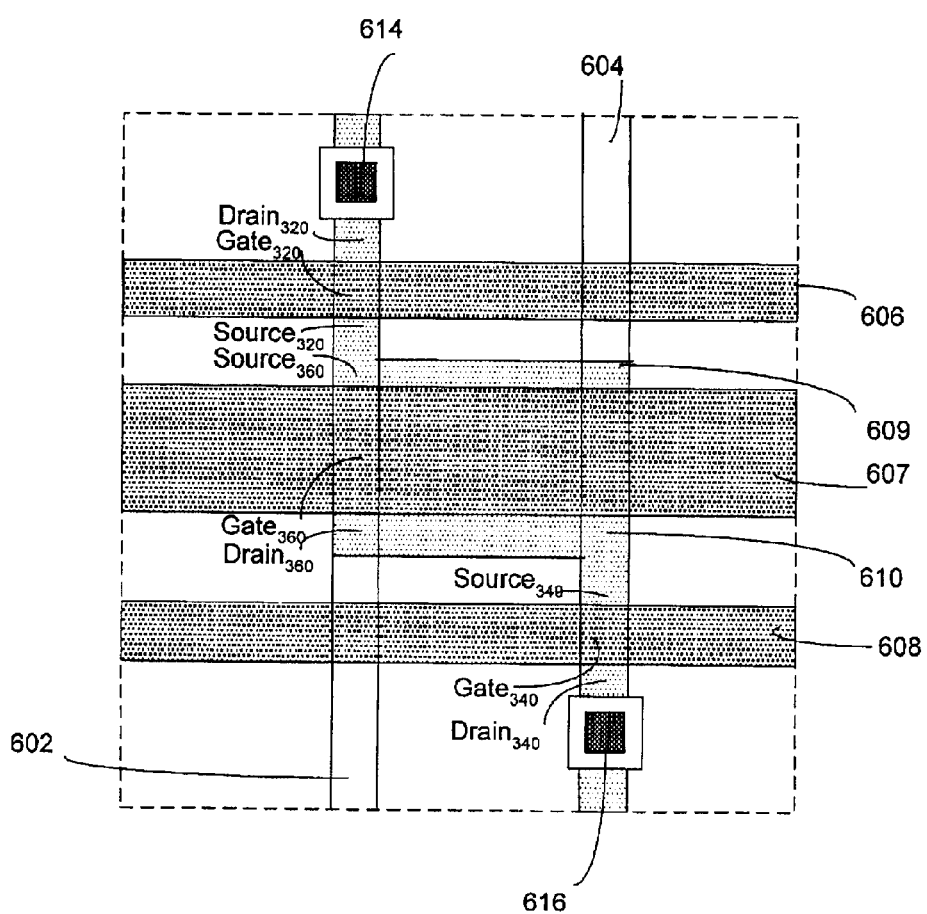
FIG. 6 shows a section from the layout of a volatile semiconductor memory designed according to the memory cell shown in FIG. 3.

The volatile memory cell depicted in FIG. 3 can comprise a layout as described in, for example, FIG. 6. Line paths for bit lines 602 and 604 are arranged in parallel to each other. The memory cell comprises 2 access transistors 320 and 340 controlled by line paths 606 and 608 for word lines, and a storage transistor 360 controlled by line path 607. The gate, drain and source regions are labeled accordingly in FIG. 6. Typically, the bit lines are created by a metallic circuit path, while the control word lines are formed by a polysilicon circuit path. The loading paths 609 and 610 of the transistors in the memory cell are connected in series, where the series connection defines an output path. Contact terminals 614 and 616 are used to connect output paths of neighboring memory cells to the common bit lines. An in-depth discussion of the layout of a volatile memory can be found in patent application "Layout for a Semiconductor Memory Cell", U.S. Ser. No. 09/615,987, which is herein incorporated by reference for all purposes.

The volatile memory can easily be converted to non-volatile ROM by a few masks. In one embodiment of the invention shown in FIG. 7(a), the control line path 607 is stripped down to make space for a new contact terminal 702 located on the output path and between control line paths 607 and 608. The storage transistor 360 is activated whenever the power supply is applied to the IC by applying $V_{DD}$ to the control line path 607 via a contact terminal 706. The second access transistor 340 is deactivated by applying $V_{SS}$ to the control line path 608 via a contact terminal 704.

Figure 7A:
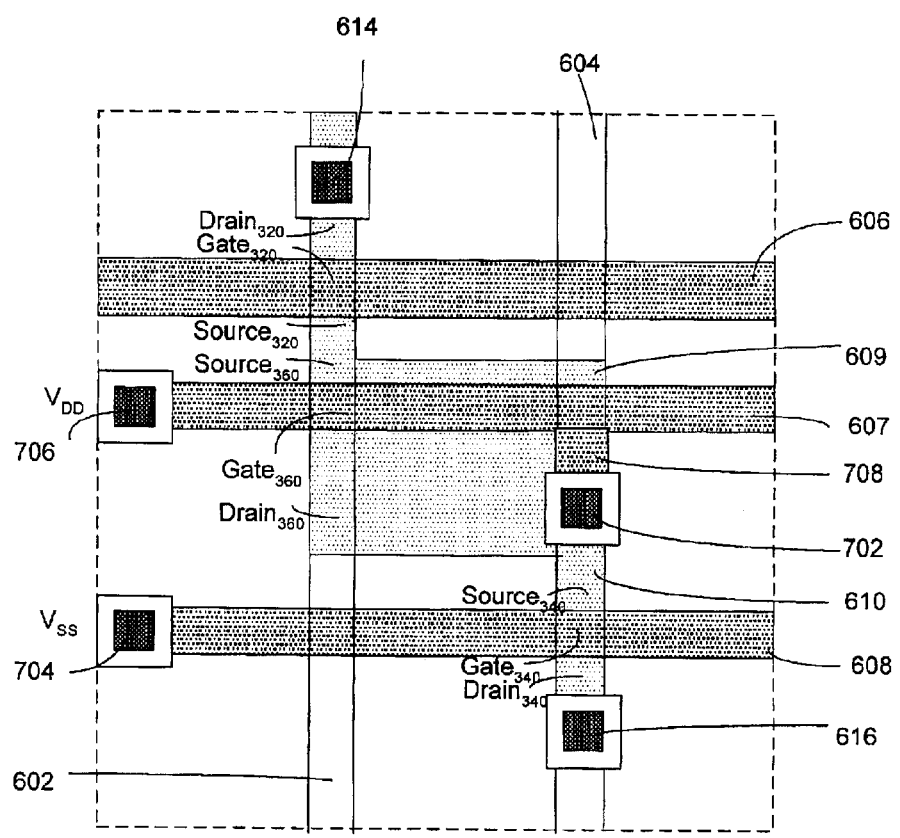
FIGS. 7(a), 7(b), 7(c), 8(a) and 8(b) show sections from the layouts of non-volatile semiconductor memory cells according to various embodiments of the invention.

Depending on the bit information to be stored (i.e. logic '1' or '0'), the contact terminal 702 is coupled to either $V_{DD}$ or $V_{SS}$ respectively. Referring to FIG. 7(a), logic '1' is stored by adding a connecting line 708 between contact terminal 702 and control word line 607, where $V_{DD}$ is applied. Typically, the connecting line 708 is formed by a polysilicon circuit path.

Figure 7B:
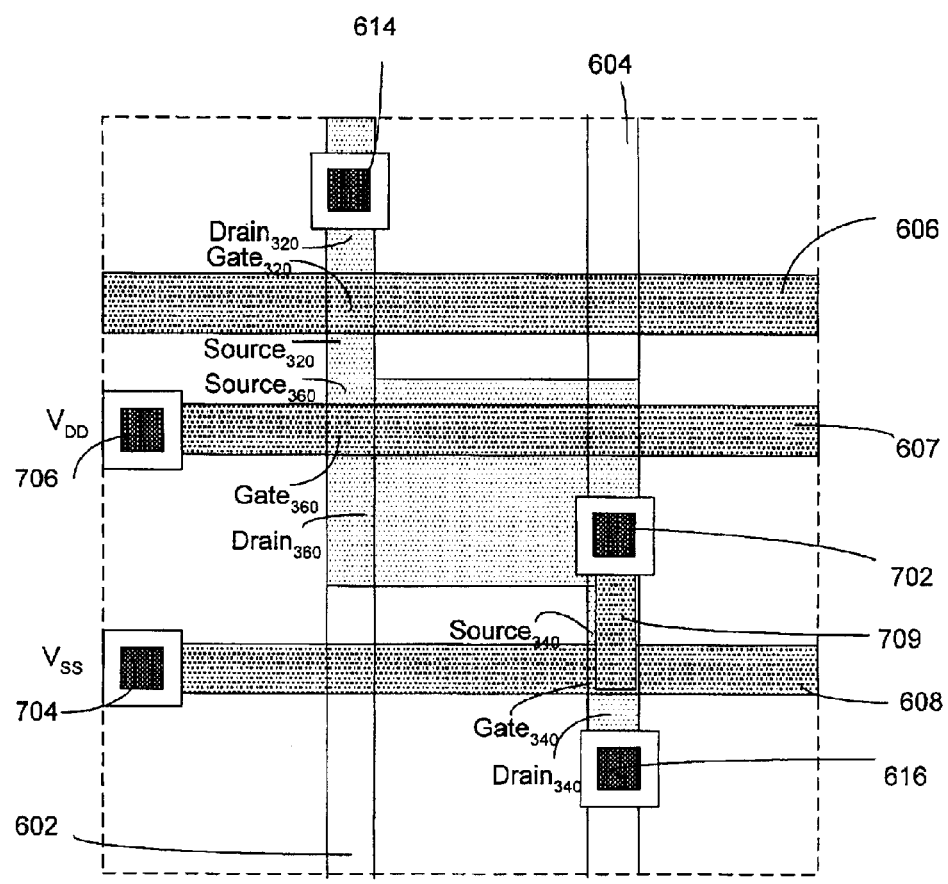
Figure 7C:
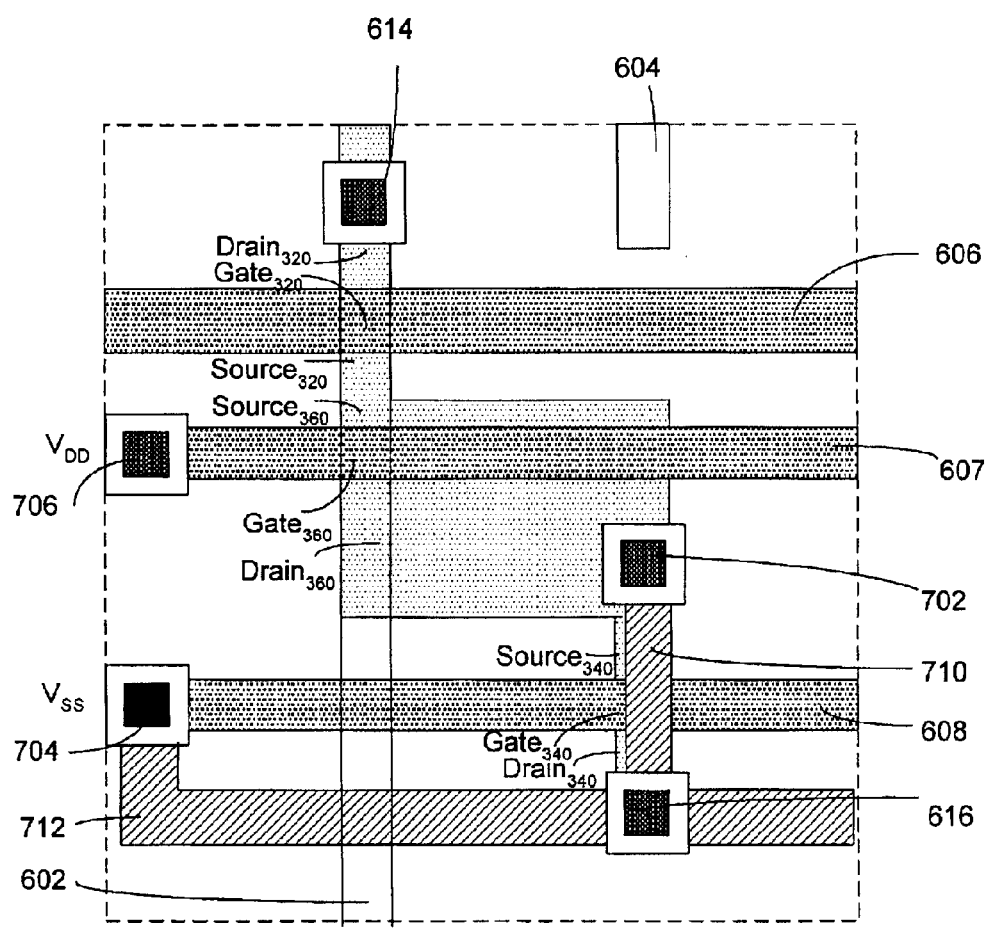

Logic '0' is stored by coupling the contact terminal 702 to $V_{SS}$. In one embodiment of the invention shown in FIG. 7(b), a connecting line 709 is added between contact terminal 702 and control word line 608 where $V_{SS}$ is applied. The connecting line 709 is typically formed by a polysilicon circuit path. Another embodiment of the invention is shown in FIG. 7(c). The bitline path 604 is stripped before a connecting line 710 is formed between contact terminals 702 and 616 to avoid shorting. The contact terminal 616 is coupled to the contact terminal 704 via a connecting path 712. The connecting lines 710 and 712 are formed by, for example, metal circuit paths.

Figure 8A:
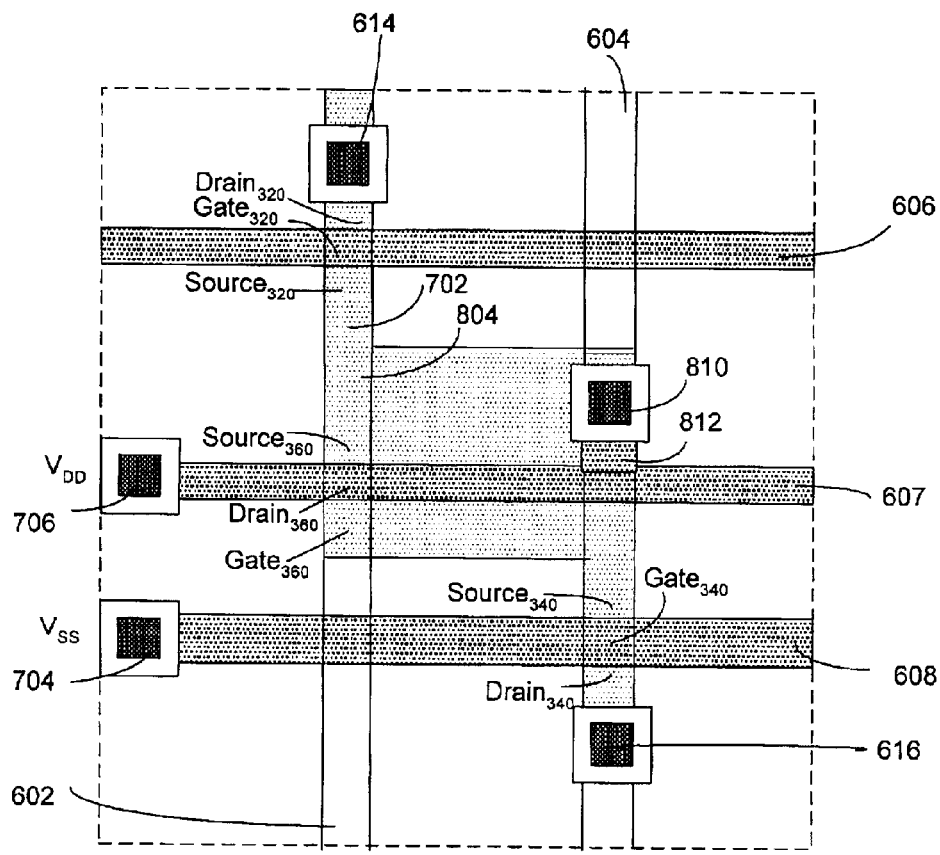
Figure 8B:
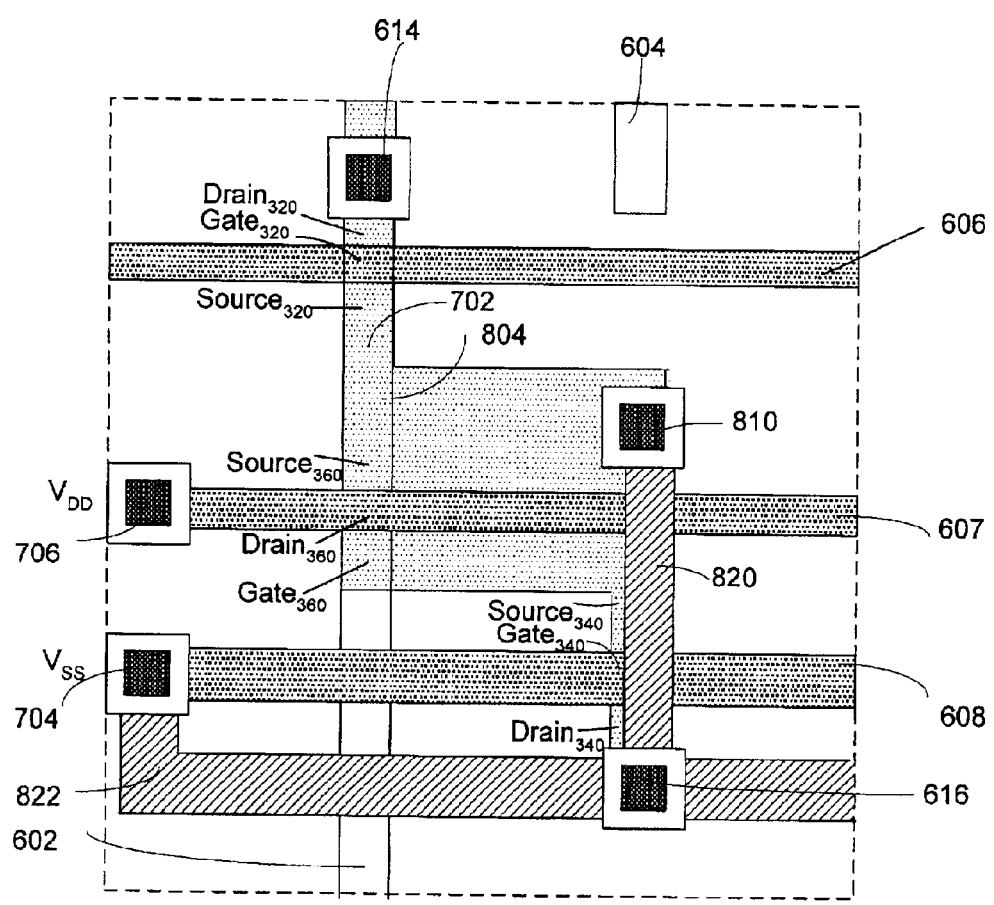

FIGS. 8(a) and 8(b) show other embodiments of the invention. Referring to FIG. 8(a), the control line path 607 is stripped down to make space for a new contact terminal 810 located on the output path and between control line paths 606 and 607. The storage transistor 360 is activated whenever the power supply is applied to the IC by applying $V_{DD}$ to the control line path 607 via a contact terminal 706. The second access transistor 340 is deactivated by applying $V_{SS}$ to the control line path 608 via a contact terminal 704.

In one embodiment, a logical state '1' is stored by forming a connecting line 812 between contact terminal 810 and control word line 607, where $V_{DD}$ is applied. Typically, the connecting line 812 is formed by a polysilicon circuit path. Another embodiment of the invention is shown in FIG. 7(c), wherein a logical state '0' is stored. The bitline path 604 is stripped before a connecting line 820 is formed between contact terminals 810 and 616 to avoid shorting. The contact terminal 616 is coupled to the contact terminal 704 via a connecting path 822. The connecting lines 820 and 822 are typically formed by metal circuit paths.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A nonvolatile memory cell comprising:

first and second access transistors, each with a gate and first and second terminals;

first and second bit lines, the first bit line coupled to the first terminal of the first access transistor and the second bit line coupled to the first terminal of the second access transistor;

first and second word lines, the first word line coupled to the gate of the first access transistor and the second word line coupled to the gate of the second access transistor and a first voltage source, the first voltage source having a voltage level lower than the threshold voltage of the second access transistor to ensure the second access transistor is permanently deactivated;

a storage transistor having a gate and first and second terminals, the first and second access transistors and the storage transistor are coupled in series such that the first terminal of the storage transistor is coupled to the second terminal of the first access transistor, the gate of the storage transistor is coupled to a first node, and the second terminal of the storage transistor is coupled to the second terminal of the second access transistor to form a second node, wherein the first node is coupled to a second voltage source having a voltage level higher than the threshold voltage of the storage transistor to ensure the storage transistor is activated; and the second node is permanently coupled to either a first voltage level or a second voltage level representing a first or a second state, depending on the desired information to be stored in the memory cell.

2. A memory cell according to claim 1, further including the second node coupled to the second word line to receive a low voltage signal from the first voltage source.

3. A nonvolatile memory cell according to claim 1 further including the second node coupled to the first node to receive a high voltage signal from the second voltage source.

4. A nonvolatile memory cell comprising:

first and second access transistors, each with a gate and first and second terminals;

first and second bit lines, the first bit line coupled to the first terminal of the first access transistor and the second bit line coupled to the first terminal of the second access transistor;

first and second word lines, the first word line coupled to the gate of the first access transistor and the second word line coupled to the gate of the second access transistor and a first voltage source, the first voltage source having a voltage level lower than the threshold voltage of the second access transistor to ensure the second access transistor is permanently deactivated;

a storage transistor having a gate and first and second terminals, the first and second access transistors and the storage transistor are coupled in series such that the first terminal of the storage transistor is coupled to the second terminal of the first access transistor to form a second node, the gate of the storage transistor is coupled to a first node, and the second terminal of the storage transistor is coupled to the second terminal of the second access transistor, wherein the first node is coupled to a second voltage source having a voltage level higher than the threshold voltage of the storage transistor to ensure the storage transistor is activated; and the second node permanently configured to receive a voltage signal either from the first voltage source or the second voltage source depending on whether a first state or a second state is to be stored in the memory cell.

5. A memory cell according to claim 4 further including: the second node coupled to the second word line to receive a low voltage signal from the first voltage source.

6. A nonvolatile memory cell according to claim 4 further including the second node coupled to the first node to receive a high voltage signal from the second voltage source.

7. A method for converting a volatile memory cell to a non-volatile memory cell comprising:

coupling a first bit line to a first terminal of a first access transistor and a second bit line to a first terminal of a second access transistor;

coupling a first word line to a gate of the first access transistor and a second word line to a gate of the second access transistor;

permanently deactivating the second access transistor by coupling the second word line to a first voltage source, the first voltage source having a voltage level lower than the threshold voltage of the second access transistor to ensure the second access transistor is deactivated;

coupling a storage transistor in series with the first and second access transistors such that a first terminal of a storage transistor is coupled to a second terminal of the first access transistor and a second terminal of the storage transistor is coupled to a second terminal of the second access transistor, wherein the coupling of the second terminals of the storage and second access transistors form a second node;

coupling a gate of the storage transistor to a first node;

activating the storage transistor by coupling the first node to a second voltage source, the second voltage source having a voltage level higher than the threshold voltage of the storage transistor to ensure the storage transistor is activated; and permanently configuring the second node to receive a voltage signal either from the first voltage source or the second voltage source, depending on the desired information to be stored in the memory cell.

8. A method for converting a volatile memory cell to a non-volatile memory cell according to claim 7 further including: coupling a second node to second word line to receive a low voltage signal from the first voltage source.

9. A method for converting a volatile memory cell to a non-volatile memory cell according to claim 7 further including coupling the second node to the first node to receive a high voltage signal from the second voltage source.

10. A method for converting a volatile memory cell to a non-volatile memory cell comprising:

coupling a first bit line to a first terminal of a first access transistor and a second bit line to a first terminal of a second access transistor;

coupling a first word line to a gate of the first access transistor and a second word line to a gate of the second access transistor;

deactivating the second access transistor by coupling the second word line to a first voltage source, the first voltage source having a voltage level lower than the threshold voltage of the second access transistor to ensure the second access transistor is permanently deactivated;

coupling a storage transistor in series with the first and second access transistors such that a first terminal of a storage transistor is coupled to a second terminal of the first access transistor to form a second node and a second terminal of the storage transistor is coupled to a second terminal of the second access transistor;

coupling a gate of the storage transistor to a first node;

activating the storage transistor by coupling the first node to a second voltage source, the second voltage source having a voltage level higher than the threshold voltage of the storage transistor to ensure the storage transistor is activated; and permanently configuring the second node to receive a voltage signal either from the first voltage source or the second voltage source, depending on the desired information to be stored in the memory cell.

11. A method for converting a volatile memory cell to a non-volatile memory cell according to claim 10 further including: coupling the second node to the second word line to receive a low voltage signal from the first voltage source.

12. A method for converting a volatile memory cell to a non-volatile memory cell according to claim 10 further including coupling the second node to the first node to receive a high voltage signal from the second voltage source.

13. Layout for a semiconductor memory comprising:

a plurality of memory cells, each having two access transistors and one storage transistor coupled in series, whose loading paths are connected in series, wherein the series connection of the loading paths defines an output path of each memory cell;

first and second contact terminals connecting the output paths of neighboring memory cells to common first and second output bit lines respectively;

first and second control line paths connected to first and second word lines, and controlling the first and second access transistors respectively, the second control line path connected to a first voltage source via a third contact terminal, the first voltage source having a voltage level lower than the threshold voltage of the second access transistor to ensure the second access transistor is permanently deactivated;

a third control line path connected to a second voltage source via a fourth contact terminal, the third control line path controlling the storage transistor, and the second voltage source having a voltage level higher than the threshold voltage of the storage transistor to ensure the storage transistor is activated; and a fifth contact terminal located between the second and third control line paths and on the output path of each memory cell.

14. Layout for a semiconductor memory according to claim 13 wherein the fifth contact terminal is connected to the third control line path.

15. Layout for a semiconductor memory a plurality of memory cells, each having two access transistors and one storage transistor, whose loading paths are connected in series, wherein the series connection of the loading paths defines an output path of each memory cell;

first and second contact terminals connecting the output paths of neighboring memory cells to common first and second output bit lines respectively;

first and second control line paths connected to first and second word lines, and controlling the first and second access transistors respectively, the second control line path connected to a first voltage source via a third contact terminal, the first voltage source having a voltage level lower than the threshold voltage of the second access transistor to ensure the second access transistor is deactivated;

a third control line path connected to a second voltage source via a fourth contact terminal, the third control line path controlling the storage transistor, and the second voltage source having a voltage level higher than the threshold voltage of the storage transistor to ensure the storage transistor is activated; and a fifth contact terminal located between the second and third control line paths and on the output path of each memory cell, wherein the fifth contact terminal is connected to the second control line path.

16. Layout for a semiconductor memory according to claim 13 wherein the fifth contact terminal is connected to the second contact terminal, the second contact terminal being connected to the third contact terminal.

17. Layout for a semiconductor memory comprising:

a plurality of memory cells, each having two access transistors and one storage transistor coupled in series, whose loading paths are connected in series, wherein the series connection of the loading paths defines an output path of each memory cell;

first and second contact terminals connecting the output paths of neighboring memory cells to common first find second output bit lines respectively;

first and second control line paths connected to first and second word lines, and controlling the first and second access transistors respectively, the second control line path connected to a first voltage source via a third contact terminal, the first voltage source having a voltage level lower than the threshold voltage of the second access transistor to ensure the second access transistor is permanently deactivated;

a third control line path connected to a second voltage source via a fourth contact terminal, the third control line path controlling the storage transistor, and the second voltage source having a voltage level higher than the threshold voltage of the storage transistor to ensure the storage transistor is activated; and a fifth contact terminal located between the first and third control line paths and on the output path of each memory cell.

18. Layout for a semiconductor memory according to claim 17 wherein the fifth contact terminal is connected to the third control line path.

19. Layout for a semiconductor memory according to claim 17 wherein the fifth contact terminal is connected to the second contact terminal, the second contact terminal being connected to the third contact terminal.

* * * * *